(12) United States Patent
Shannon

(10) Patent No.: US 6,362,756 B1
(45) Date of Patent: Mar. 26, 2002

(54) SYSTEM AND METHOD FOR COMPRESSING DATA

(75) Inventor: Terrence M. Shannon, Kuna, ID (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/820,494

(22) Filed: Mar. 28, 2001

(51) Int. Cl.$^7$ ................................................ H03M 7/00
(52) U.S. Cl. ...................................................... 341/87
(58) Field of Search .................... 341/87, 106; 375/240, 375/241, 242

(56) References Cited

U.S. PATENT DOCUMENTS 6,304,601 B1 * 10/2001 Davison ....................... 341/87

* cited by examiner

Primary Examiner—Brian Young
(74) Attorney, Agent, or Firm—Matthew L. Wade

(57) ABSTRACT

A computer operable to encode a string of tokens is described. The string of tokens includes a group of tokens that immediately follow a token having a first value. The Computer operates to select a token value that occurs most often in the group. The computer can then operate to convert the first string of tokens into a second string of tokens by substituting each occurrence of a token-pair unit in the first string with a single token. The token-pair unit includes a first token having the first value and a second token having the selected value. The computer then operates to identify a group of tokens in the second string. The identified group of tokens are those tokens that follow a token having the first value. The computer then operates to Huffman encode the second string. In part, this is accomplished by Huffman encoding the identified group based upon the identified group's local frequencies.

20 Claims, 16 Drawing Sheets

SYSTEM AND METHOD FOR COMPRESSING DATA

CROSS-REFERENCES

This application is related to the application having Ser. No. 09/820,493, filed on the same date as this application, entitled "System and Method for Encoding and Decoding Data", by inventor Terrence Shannon. That application is incorporated herein by this reference.

BACKGROUND OF THE INVENTION

Data is often compressed in order to reduce computer memory requirements or to reduce transmission time. One popular data compression technique may be referred to as "entropy coding".

Huffman coding is one example of an entropy coding technique. A Huffman encoder will typically utilize a Huffman statistical model to convert a string of tokens into a series of variable length entropy codes. The Huffman encoder operates to assign short entropy codes to the tokens that occur most often and longer codewords to the tokens that occur the least often. The codewords that are used in Huffman encoding are typically obtained from one or more tables, known as Huffman Tables.

While prior art entropy coding techniques have proven to be very useful, improvements in these techniques are always needed in order to reduce the memory requirements of computing systems as well as to improve the speed at which data can be communicated from one computer to another.

SUMMARY OF THE INVENTION

The present invention may be implemented as a method of compressing a first string of tokens. The first string of tokens including a group of tokens that immediately follow a token having a first value. The method includes selecting a token value that occurs in the group based upon the group's local frequencies; and producing a second string by substituting each occurrence of a token-pair unit in the first string with a single token having a second value; and wherein the token-pair unit includes a first token having the first value and a second token having the selected value.

The present invention may also be implemented as apparatus for compressing a first string of tokens. The first string of tokens includes a first group of tokens each having a first value and a second group of tokens each immediately following a unique one of the tokens in the first group. The apparatus is operable to identify a token value from the second group based upon the local frequencies of the second group The apparatus is further operable to define a token-pair unit, the token-pair unit including a first token having the first value and a second token having the selected value. The apparatus is further operable to convert the first string into a second string in part by substituting each occurrence of the token-pair unit in the first string with a single token having a third value.

Other aspects and advantages of the present invention will become apparent from the following detailed description, taken in conjunction with the accompanying drawings, illustrating by way of example the principles of the invention.

BRIEF DESCRIPTION OF THE DRAWINGS

The invention can be understood with reference to he following drawings. The drawings are not necessarily to scale.

DETAILED DESCRIPTION OF THE INVENTION

A number of computing systems generate token strings wherein an identifiable subset of tokens, interspersed throughout the string, exhibit a non-random frequency distribution that is different than the frequency distribution of the string itself. As will be illustrated in the following exemplary embodiment, the present invention provides a new and advantageous way to compress such strings in an efficient manner.

Figure 1:
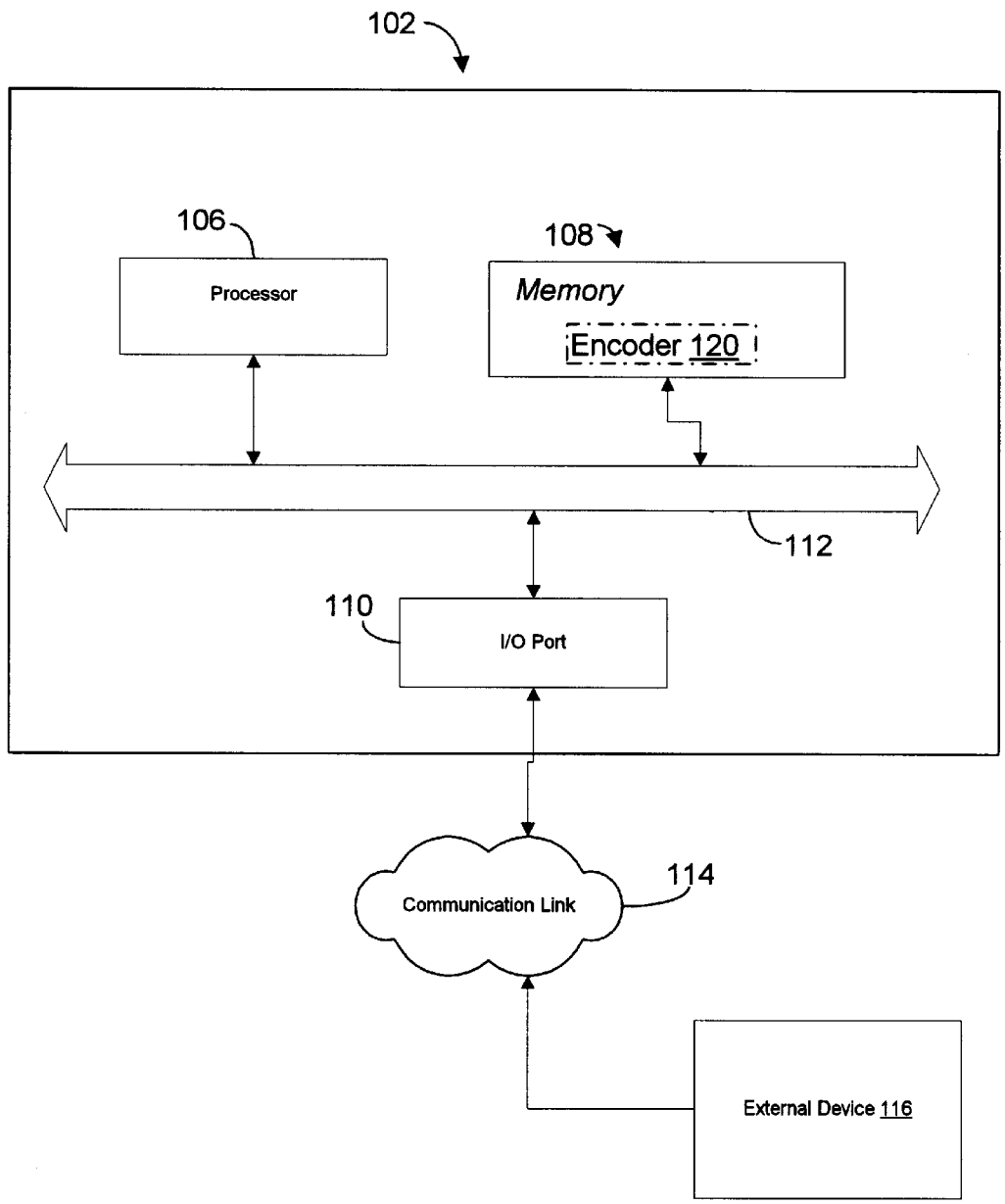
FIG. 1 is a block diagram of a computing system that embodies the invention.

As shown in FIG. 1, for purposes of illustration, the invention is embodied in a computer 102 operable to encode tokens strings that may be received, for example, from an external device 116. The computer 102 is further operable to encode tokens strings that are internally generated.

The computer 102 includes a processor 106, a memory 108 and an I/O port 110. All these devices are connected via a local interface 112. The local interface 112 may include, for example, one or more data buses with accompanying control buses. The I/O port 110 facilitates communications with the external device 116 via a communication link 114. The communication link 114 may represent a network such as an Intranet or the INTERNET. The communication link 114 may also represent a parallel port or a serial port. The external device 116 may represent any type of device that can transmit a string of tokens to the computer 102.

The processor 106 is used to execute programs that are stored in the memory 108. One of these programs is an encoder program 120. As will be explained in greater detail below, the encoder 120 enables the computer 102 to Huffman encode token strings received, for example, from the external device 116.

We will assume for purposes of this example that it is a known characteristic of the external device 116 to generate strings wherein "D" tokens immediately follow "B" tokens. Thus, it may be said that "D" tokens and "B" tokens are correlated. "D" tokens, however, do not necessarily have the highest overall frequency of occurrence in the string.

Figure 2:
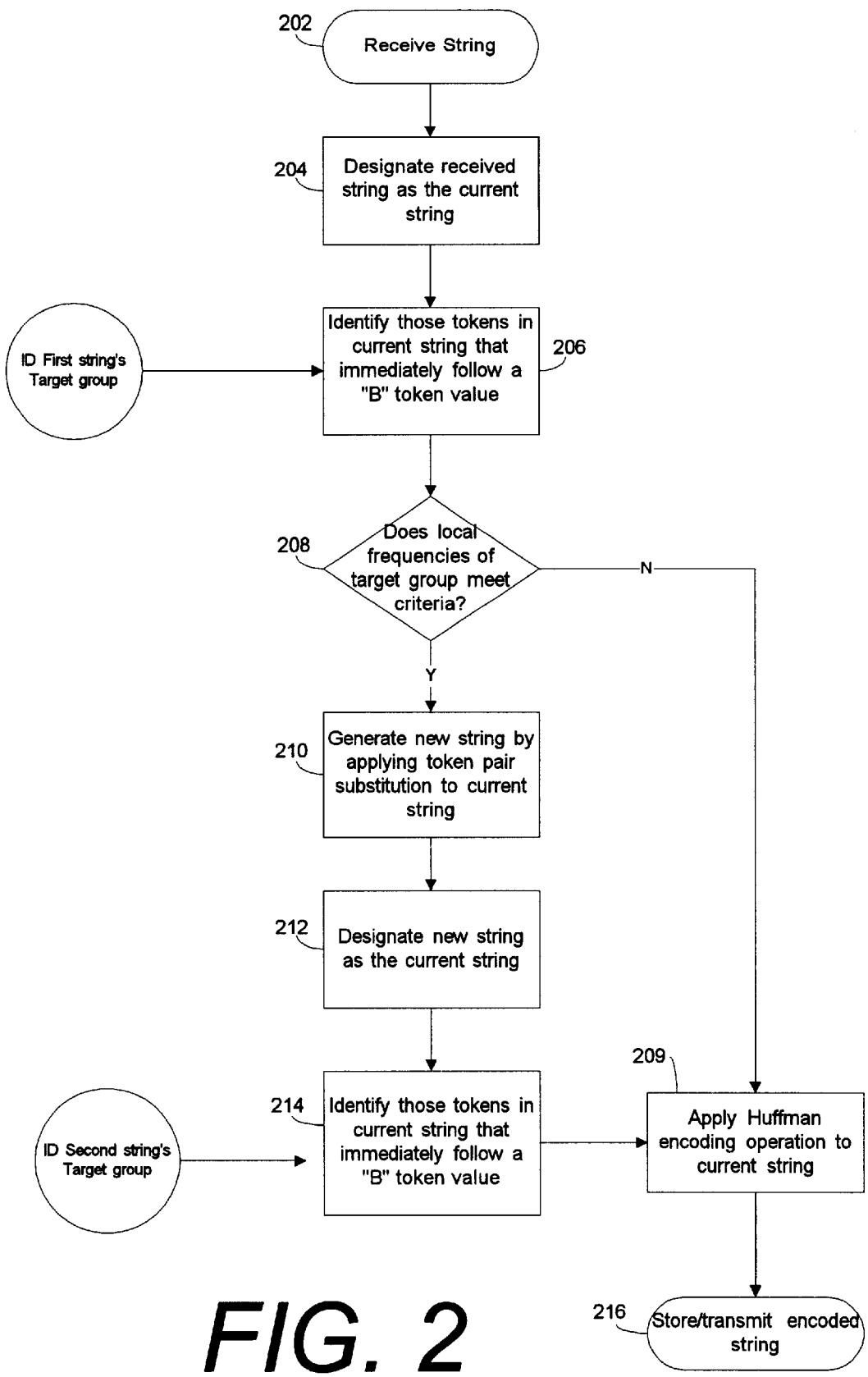
FIG. 2 is a flow diagram illustrating the operation of a computer to encode a string of tokens.

FIG. 2 is a flow diagram illustrating the operation of the computer 102, as directed by execution of the encoder program 120, to encode a string of tokens. Turning now to FIG. 2, the computer 102 first operates to receive a string of tokens (step 202). The computer 102 responds by designating the string as the "current string" (step 204).

Next, the computer 102 operates to identify those tokens in the current string that immediately follow a particular reference token value (step 206). In this example, the "reference token value" is predetermined to be a "B" token value. Thus, the computer 102 operates to identify those tokens in the current string that immediately follow a "B" token value.

For ease of discussion, the tokens identified at step 206 will be referred to herein as the "first string's target group". The target group may be referred to as having a "B" reference token value.

Figure 3:
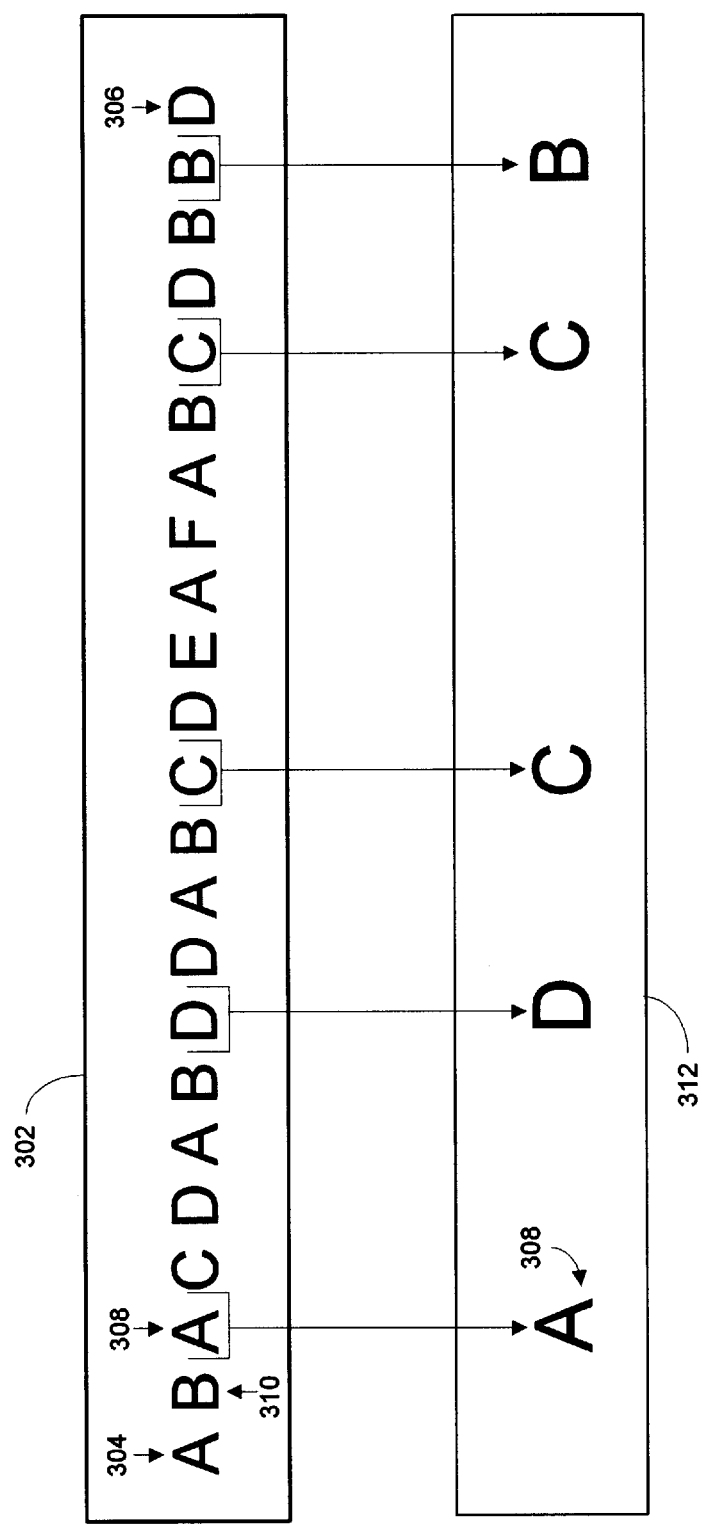
FIG. 3 shows an exemplary string of token and shows a target group of tokens in the string.

In order to illustrate further step 206 consider FIG. 3. FIG. 3 shows an exemplary token string 302. The first token 304 in the string 302 has an A value. The last token 306 has a "D" value. Those tokens that immediately follow a "B" token value are shown within box 312.

Thus, the tokens shown within box 312 would be the tokens that are identified at step 206. For example, because "A" token 308 immediately follows "B" token 310, "A" token 308 is one of the tokens identified at step 206 and is therefore shown within box 312.

Turning again to FIG. 2, the computer 102 operates to determine if the "local frequencies" of the first string's target group meet certain pre-determined criteria (decision step 208).

For ease discussion, the phrase "local frequencies" refers to the frequency of occurrence of each token value in a particular group. Thus, the "local frequencies" of a given target group refers to the number of times each token value occurs in that group. Furthermore, the phrase "local frequency" of a particular token value in a given target group refers to the number of times that value occurs in the group. Thus, the local frequency of token value "A" in a target group refers to the number of times token value "A" occurs in the target group.

In this embodiment, the local frequencies of the first target group meet the pre-determined criteria of step 208 if the following two relationships are true:

Relationship #1: $f(max) > f(max-1) + f(max-2)$; and Relationship #2: $f(max) > N$ Wherein "f(max)" is the local frequency of the token value that occurs most often in the first string's target group; "f(max−1)" is the local frequency of the token value that occurs the second most often; and "f(max−2)" is the local frequency of the token value that occurs the third most often. "N" in a pre-determined threshold value.

To illustrate further decision step 208, assume for a moment that table 1 represents the local frequencies of the first string's target group:

TABLE 1

| Token Value | Frequency of occurrence in first target group | Notes |
| --- | --- | --- |
| A | 100 | |
| B | 200 | |
| C | 300 | f(max−2) |
| D | 400 | f(max−1) |
| E | 500 | f(max) |

Thus in this example, $f(max)=500$; $f(max-1)=400$; and $f(max-2)=300$ and relationship #1 is not true as 500 is not $>(400+300)$ If the criteria of decision step 208 are not met, the computer 102 operates to Huffman encode the first string (step 209). As will be seen, this is accomplished, in part, by Huffman encoding the first string's target group based upon the group's local frequencies. The rest of the tokens in the first string are Huffman encoded based upon the first string's "aggregate frequencies". As used herein, the phrase "aggregate frequencies" refers to the total number of times each token value occurs in the string.

If the criteria of decision step 208 are met, the computer 102 generates a second string by substituting certain token pairs in the first string with a single token value (step 210). The second string is then designated as the "current string" (step 212). The computer 102 then operates to identify those tokens in the second string that immediately follow a "B" token value (step 214). For ease of discussion, this second group of tokens will be referred to as the "second string's target group". Next, the computer 102 operates to Huffman encode the second string (step 209). This is accomplished, in part, by Huffman encoding the second string's target group based upon the group's local frequencies. The rest of the tokens in the second string are Huffman encoded based upon the second string's aggregate frequencies.

After either the first or the second string is encoded at step 209, the computer may appropriately store the encoded string and then transmit the encoded string to another device (step 216).

Lets now considers some of the steps just described in more detail. We will begin with a discussion of the Huffman encoding operation that is performed at step 209.

Huffman Encoding Operation

Figure 4:
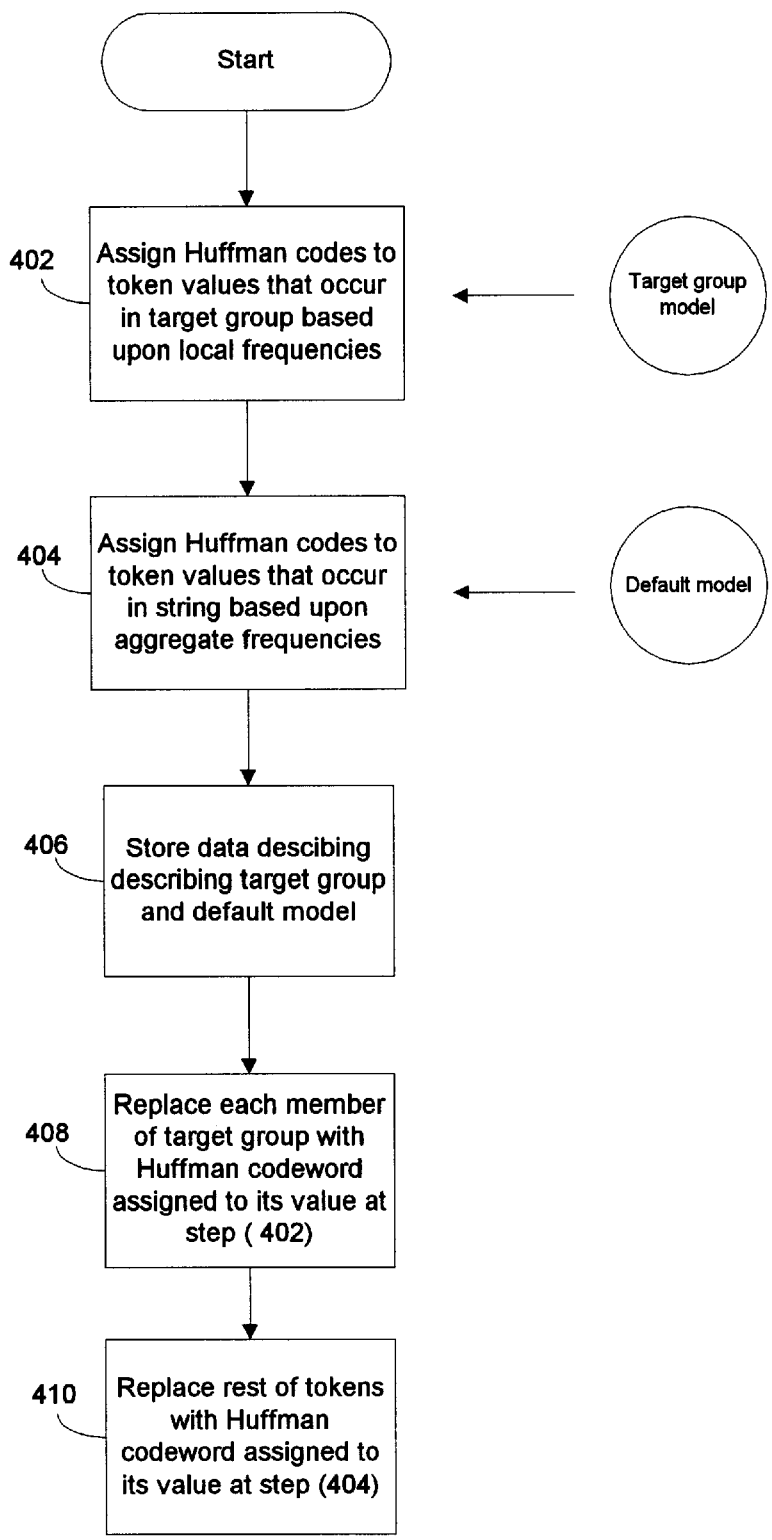
FIG 4 is a flow diagram illustrating a Huffman encoding operation.

FIG. 4 is a flow diagram illustrating the Huffman encoding operation that is applied to either the first or the second string at step 209. Turning now to FIG. 4, the computer 102 begins the Huffman encoding operation by assigning a Huffman codeword to each token value that occurs in the string's target group (step 402). Importantly, these assignments are based upon the local frequencies of the target group. Thus, for example, if token value "D" occurs most often in the target group, this value is assigned the shortest Huffman codeword.

Next, the computer 102 operates to assign a Huffman codeword to each token value that occurs in the string (step 404). These assignments are based upon the aggregate frequencies of the string. Thus, for example, if token value "A" occurs most often in the string, that value is assigned the shortest Huffman codeword.

For ease of discussion, the assignments made at step 402 may collectively be referred to as the "target group" model. The assignments made at step 404 may collectively be referred to as the "default model".

At step 406, the computer 102 operates to generate and to store a set of data (hereafter "model data") that describes both the target group model and the default model (step 406). The portion of the data that describes the target group model may be referred to as the "target group model data". The portion of the data that describes the default model data may be referred to as the "default model data."

The computer 102 then replaces each member of the target group with the Huffman codeword assigned to its value at step 402 (step 408). At stop 410, the computer 102 operates to replace the rest of the tokens in the string with the Huffman codeword assigned to their respective values at step 404.

To illustrate the benefit of Huffman encoding a string of tokens in this manner, consider the following example.

EXAMPLE #1

Figure 5A:
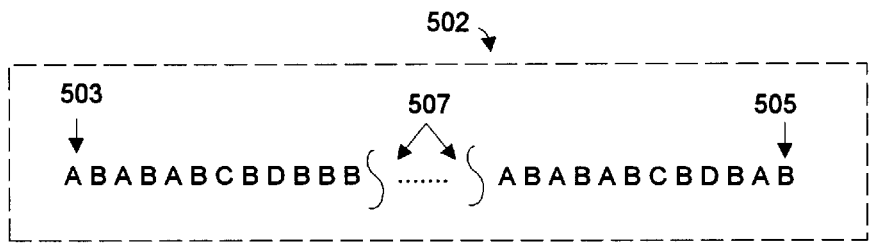
FIG. 5A depicts an exemplary string of tokens.
Figure 5:
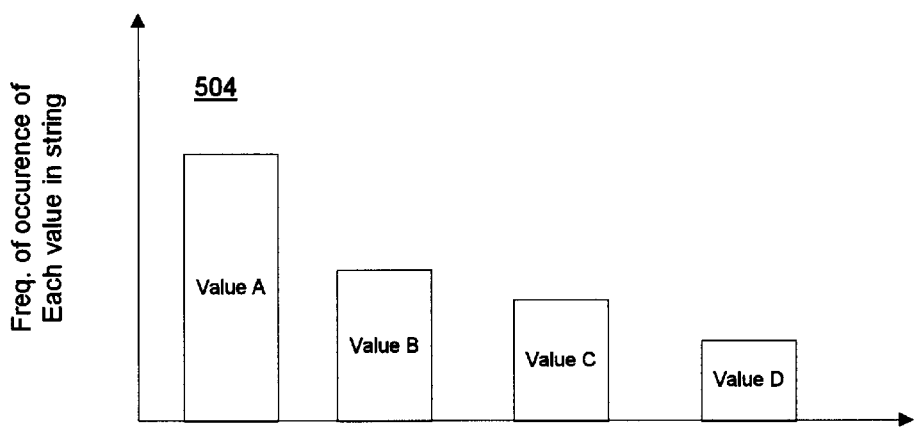
FIG. 5B is a bar graph illustrating the aggregate frequencies of the string.
FIG. 5C is a bar graph illustrating the local frequencies of the target group in the string.
Figure 5:
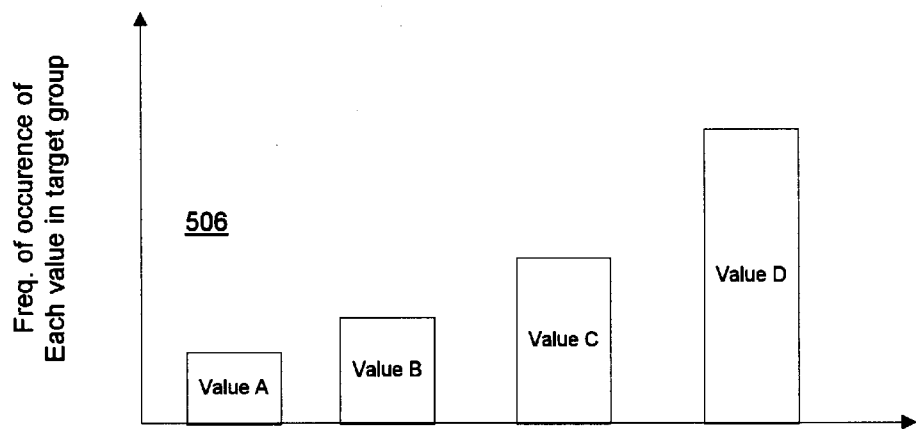

FIG. 5A depicts an exemplary string 502. FIG. 5B is a bar graph 504 illustrating the aggregate frequencies of the string 502. FIG. 5C is a bar graph 506 illustrating the local frequencies of string's target group. Now assume that the Huffman encoding operation just described is applied to the string 502.

Table 1 illustrates further the local frequencies of the target group in the string 502 in this example. Table 1 also illustrates the target group model that is defined at step 402 based upon the target group's local frequencies.

TABLE 1

| Token value | Frequencies of occurrence in target group | Huffman Code (based upon local frequencies of the target group) |
|---|---|---|
| A | 10 | 111 |
| B | 300 | 110 |
| C | 500 | 10 |
| D | 900 | 0 |

Table 2 illustrates the aggregate frequencies of the string 502. Table 2 also illustrates the default model that is defined at step 404 in this example.

TABLE 2

| Token value | Frequencies of occurrence in string | Huffman Code (based upon aggregate frequencies) |
|---|---|---|
| A | 4000 | 0 |
| B | 3000 | 10 |
| C | 2000 | 110 |
| D | 1000 | 111 |

A person skilled in the art will note that if the string 502 had boon encoded according to a typical prior art Huffman encoding procedure, the entire string 502 (including the members of the target group) would be Huffman encoded based only upon the string's aggregate frequencies. That is to say, the members of the target group would not have been encoded as an independent group.

It can also be seen that in the present system it is typically beneficial to Huffman encode string's target group based upon local frequencies. This is due to the correlation mentioned above that often exists in strings received from device 116 between "B" tokens and "D" tokens.

Token Pair Substitution (step 210)

In view of the foregoing, lets now consider how the computer 102 operates to generate a second string at step 210.

Figure 6:
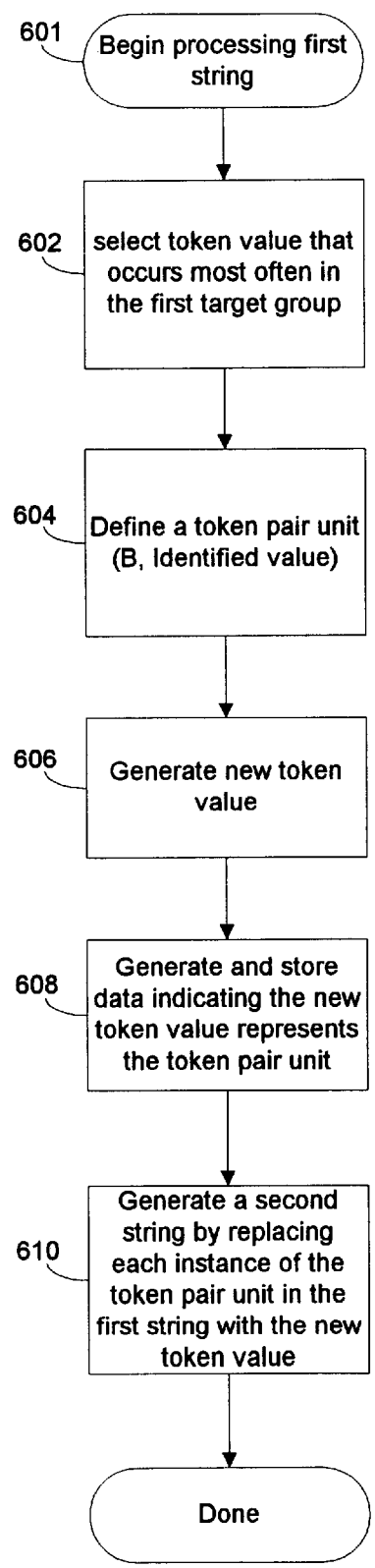
FIG. 6 is a flow diagram illustrating the steps followed by a computer to convert a first string into a second string.

FIG. 6 is a flow diagram illustrating the operation that is performed by the computer 102 to generate a second string at step 210. Turning now to FIG. 6, the computer 102 operates to first identify the token value in the first string's target group that has the highest frequency (i.e., f(max)) of occurrence (step 602).

The computer 102 then operates to define a "token-pair unit" (step 604).

For ease of discussion, a "token-pair unit" refers to a two token string. The token-pair unit defined at step 604 includes a first token having a "B" value which is the target group's reference value in this embodiment. The token-pair unit further includes a second token having the value selected at step 602.

Thus, for example, if the "D" token value is selected at step 602 (as would be expected) then the token- pair unit defined at step 604 would be At step 606, the computer 102 operates to generate a new token that does not occur in the first string. At step 608, the computer 102 operates to generate and to store data indicating the new token is representative of the defined token-pair unit. This data will be referred to herein as the "token map" data. The new token used to represent the token-pair unit will be referred to as the "representative token".

At step 610, the computer 102 operates to generate the second string by replacing each occurrence of the token-pair unit in the first string with the representative token.

Decision step 209

Lets now consider in more detail decision step 208. As noted above, the token pair substitution operation is applied to the first string only if the following two conditions are true:

Relationship #1:f(max)>f(max−1)+f(max−2); and Relationship #2:f(max)>N

A person skilled in the art, having benefit of this disclosure, will note that relationship #1 is derived from the Fibonacci series. Further, if relationship #1 is true, it can be seen that overall compression performance will likely be improved if steps 210–214 are performed prior to applying the Huffman encoding operation at step 209.

The value of "N" is selected so as to prevent the computer 102 from applying the token pair substitution operation in situations wherein the benefit of improved compression is outweighed by the penalty associated with the computing resources necessary to perform the operation itself. "N" may be, therefore, any suitable value appropriate for the system employing the invention. The value of "N" may in fact be zero for some systems.

For clarification purposes, lets now consider another simple example.

EXAMPLE #2

Figure 7A:
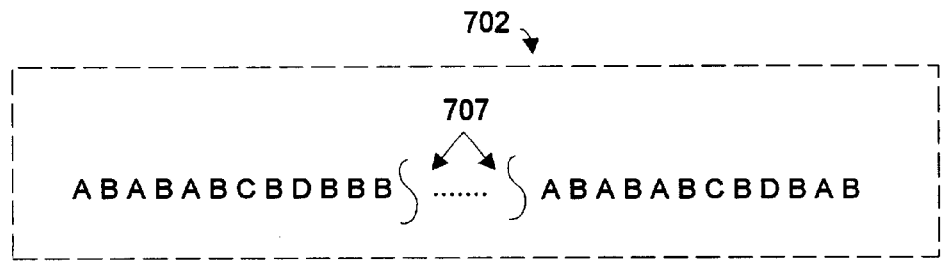
FIG. 7A illustrates an exemplary string of tokens.

FIG. 7A illustrates an exemplary "first" string of tokens 702, a number of tokens are not depicted and are represented by section 707. It will be assumed in this second example that the computer 102 receives the first string of tokens 702 at step 202. The computer 102 responds by designating the first string 702 as the "current string".

At step 206, the computer 102 operates to identify those tokens in the first string 702 that immediately follow a "B" token value. As noted above, this group of tokens may be referred to as the "first string's target group".

Figure 7B:
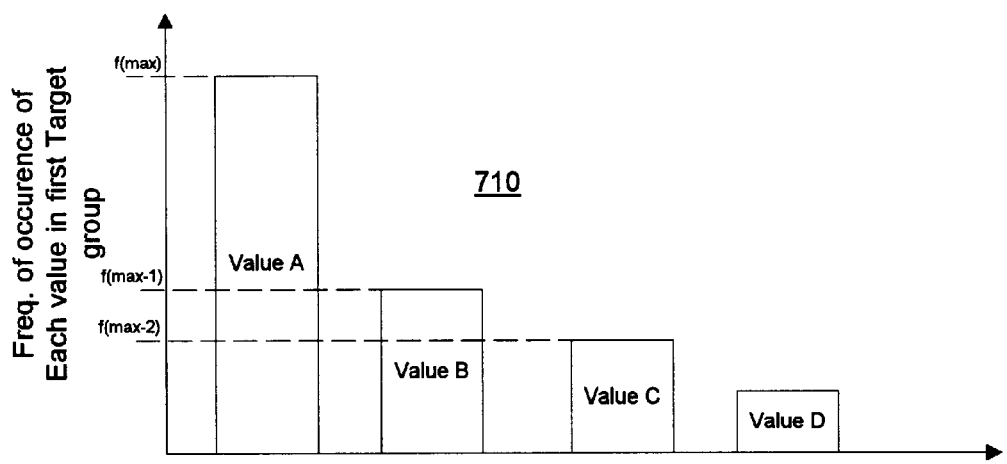
FIG. 7B is a bar graph illustrating the local frequencies of the string's first target group.

FIG. 7B is a bar graph 710 illustrating the local frequencies of the first string's target group in this example.

At step 208, the computer 102 determines if relationship #1 and relationship #2 are true. From bar graph 710 it can be seen that, in this example, f(max) is the frequency of occurrence of the "A" token value in the first string's target group.

It is assumed that both relationship #1 and relationship #2 are both true in this example. As a result, the computer 102, operates to generate a second string (see step 210) by applying the token pair substitution.

Referring now to FIG. 6, the computer 102 operates to generate the second string by first identifying the token value that occurs most often in the first string's target group (step 602). In this example, the token identified at this step would be token value "A".

Next, the computer 102 defines a token-pair unit (step 604). The token-pair unit is "B A", as the "B" token value is the reference token value for the first string's target group. Furthermore, and as just noted, the "A" token value is the value that occurs most often in the first string's target group.

Next, the computer 102 operates to generate a new token value that does not occur in the string 702 (Step 606). In this example, we will assume that the computer 102 operates to generate an "E" token value at this step. The "E" token value does not occur in the first string 702.

Next, the computer 102 operates to generate and store data indicating that the "E" token value is representative of the token-pair unit "B A" (step 608).

Next, the computer 102 operates to generate a second string (step 610). This is accomplished by replacing each occurrence of the token-pair unit "B A" in the first string 702 with an "E" token.

Figure 8:
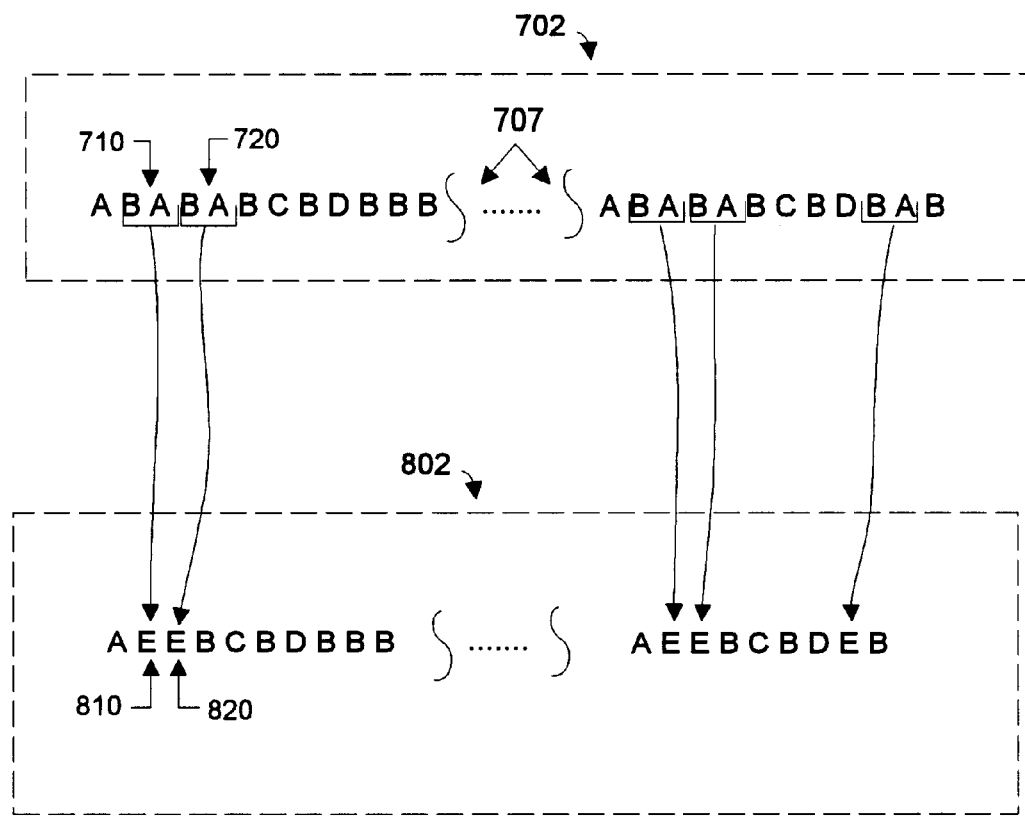
FIG. 8 illustrates a string that is generated by substituting certain token-pair unite with single tokens.

FIG. 8 illustrates the second string 802 that is generated in this example. It can be seen, for example, that a first "B A" token-pair instance 710 in the first string 702 is replaced with a single "E" token 810; a second "B A" token-pair instance 720 is replaced with a single "E" token 820, and so on.

After the second string 802 is generated, the computer 102 then designates it as the "current string" (step 212). The computer 102 then operates identify those tokens in the second string 802 that immediately follow a "B" token value (step 214). As noted above, this second group of tokens may be referred to as the "second string's target group".

Next, the computer 102 operates to apply the Huffman encoding operation to the second string 802 (step 209). Importantly, the second string is encoded, in part, by Huffman encoding the second string's target group based upon local frequencies.

Figure 9:
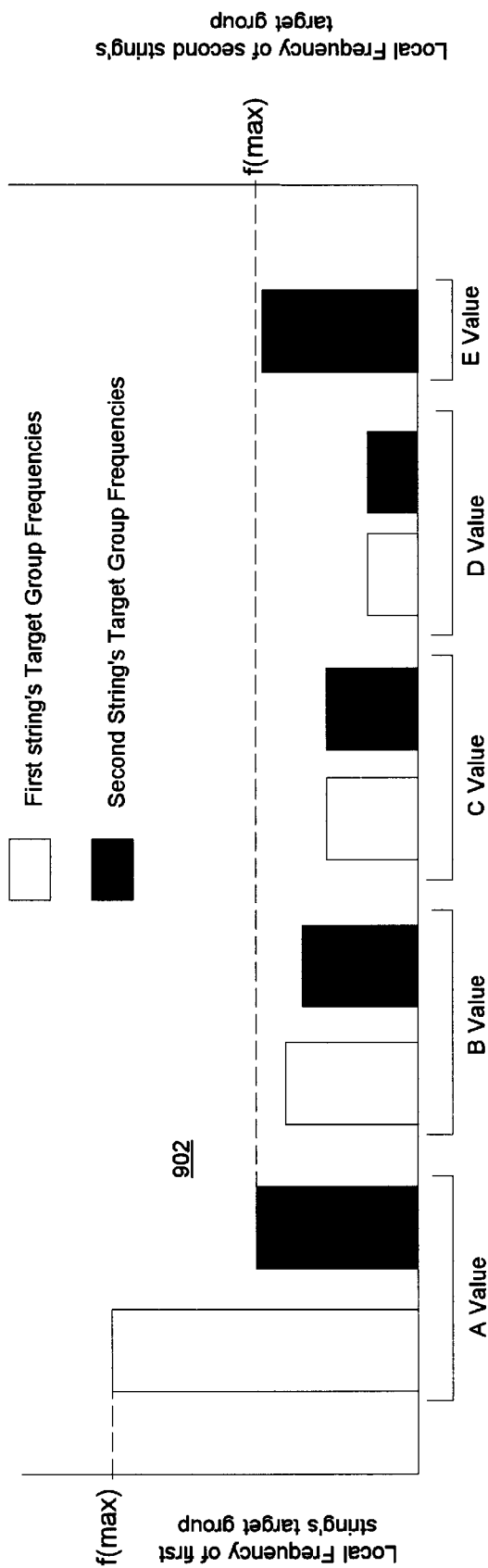
FIG. 9 is a bar graph showing the local frequencies of two target groups.

FIG. 9 is a bar graph 902 showing the local frequencies of the first and the second string's target group. Note, for example, that f(max) for the second string's target group is significantly less than the value of f(max) for the first string's target group.

Moreover, it can be seen from the foregoing that converting the first string 702 into the second string 802 prior to applying the Huffman encoding operation (step 209) results in improving compression performance.

Decoding Procedure

Figure 10:
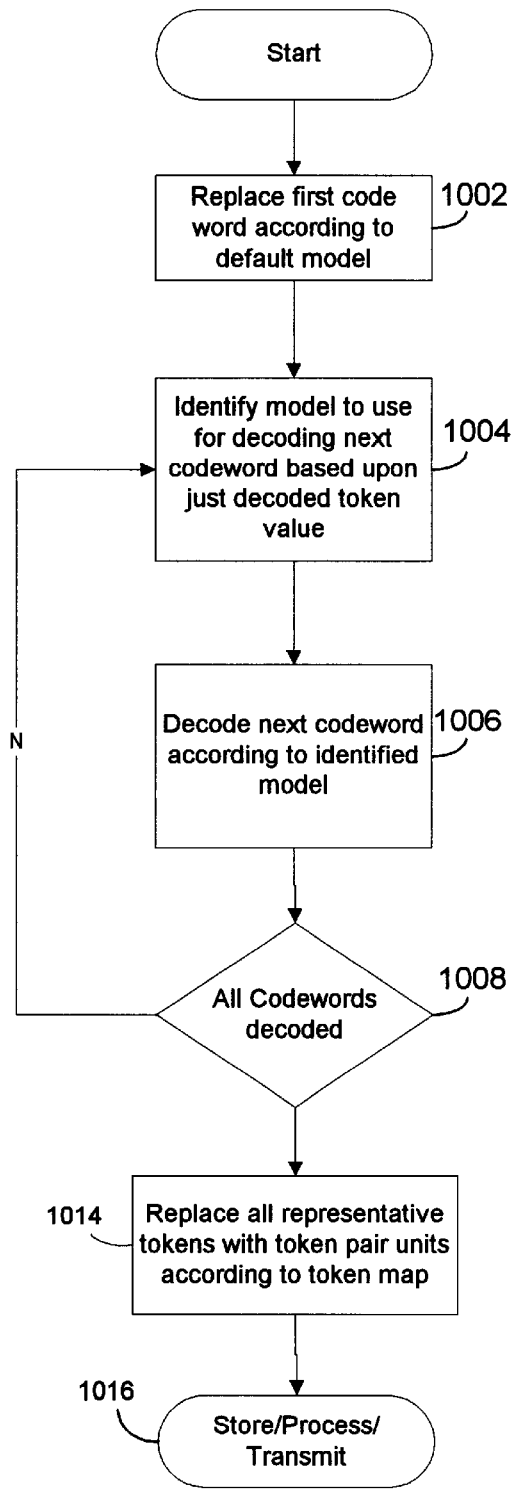
FIG. 10 is a flow diagram illustrating a decoding procedure.

FIG. 10 illustrates a second exemplary embodiment of the invention in the form of a decoding procedure that may be performed by a computer, such as the computer 102, to decode a string of codewords. It is assumed that the string of codewords was originally encoded by applying the procedure illustrated in FIG. 2.

Turning now to FIG. 10, at step 1002, the computer decodes the first codeword in the encoded string by replacing it with a token value according to the default model (as described by the Default Huffman model data).

At step 1004, the computer identifies which model to use to decode the next codeword in the string. Importantly, this step is based upon the value of the just decoded token. If the just decoded token is a "B" value, then the computer determines that the next codeword should be decoded according to the target group Huffman model (as described by the target group Huffman model data). If, however, the just decoded token is not a "B" value, the computer determines that the next codeword should be decoded according to the default Huffman model.

At step 1006, the computer replaces the next codeword in the string with a token value according to the model identified at step 1004.

After the codeword is replaced, the computer then determines if all the codewords have been decoded (decision step 1008). If not, then the computer repeats steps 1004–1006.

Once all the codewords have been decoded, all "representative" tokens are replaced with their assigned token-pair units as described by the token map data (step 1014). Thus, for example, if E tokens were substituted for A B token-pair units, then each E token in the string is replaced with an "A B" token-pair unit. It is noted that this step may actually be performed in parallel with steps 1004–1008.

After step 1014 is completed, the encoded string is now decoded and the decoded string may be appropriately stored, further processed, transmitted, etc (step 1016).

Third Embodiment

It is important to note that the present invention can be used to improve data compression in many different types of computing systems. For example, the present invention may be incorporated in various types of imaging and printing systems. To illustrate this and other aspects of the invention, attention is now directed to FIG. 11.

Figure 11:
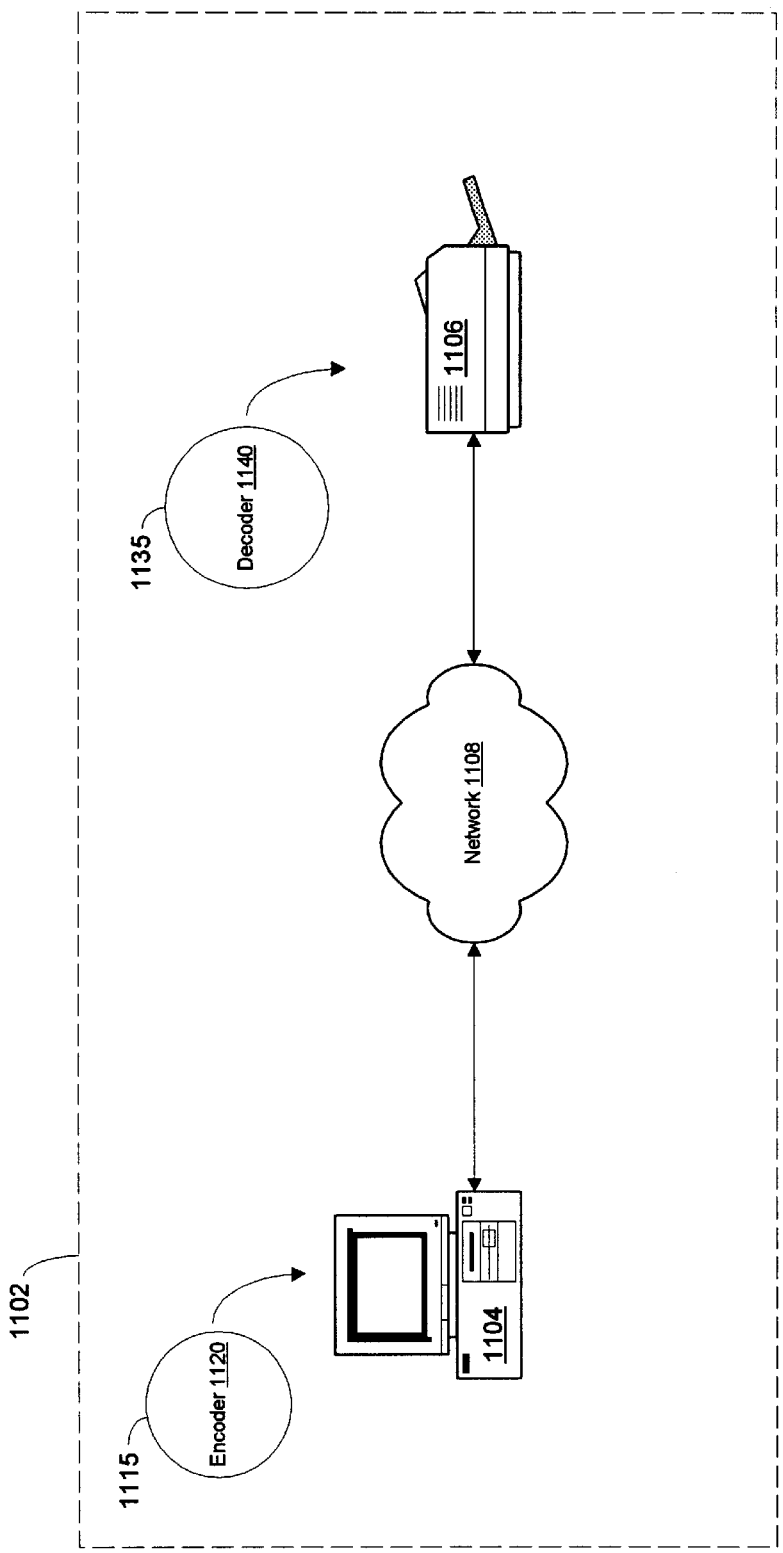
FIG. 11 illustrates another computing system that embodies the invention.

As shown in FIG. 11, for purposes of illustration, the invention is embodied in a computing system 1102. The computing system 1102 includes a general purpose computer 1104 connected to a printer 1106 over a network 1108. The general purpose computer 1104, in this example, is operative to generate a strings of tokens each describing a digital image. It is assumed that the computing system 1102 tends to generate strings wherein the following correlations exist: "B" token often immediately follow "A" tokens; "C" tokens often immediately follow "B" tokens and "D" tokens often immediately follow "C" tokens.

The printer 1106 may employ any printing technology (either presently known or yet to be developed) to print images on print media.

Also depicted in FIG. 11 is a first storage medium 1115 and a second storage medium 1135. The first storage medium 1115 includes an encoder program 1120. The encoder program 1120 is computer readable code for causing a computer, such as the computer 1104, to apply the procedure depicted in FIG. 12 to encode a string of tokens.

The second storage medium 1135 includes a decoder program 1140 stored therein. The decoder program 1140 is for causing a computerized device, such as the printer 1106, to perform the procedure described in FIG. 16 to decode an encoded string.

Figure 12:
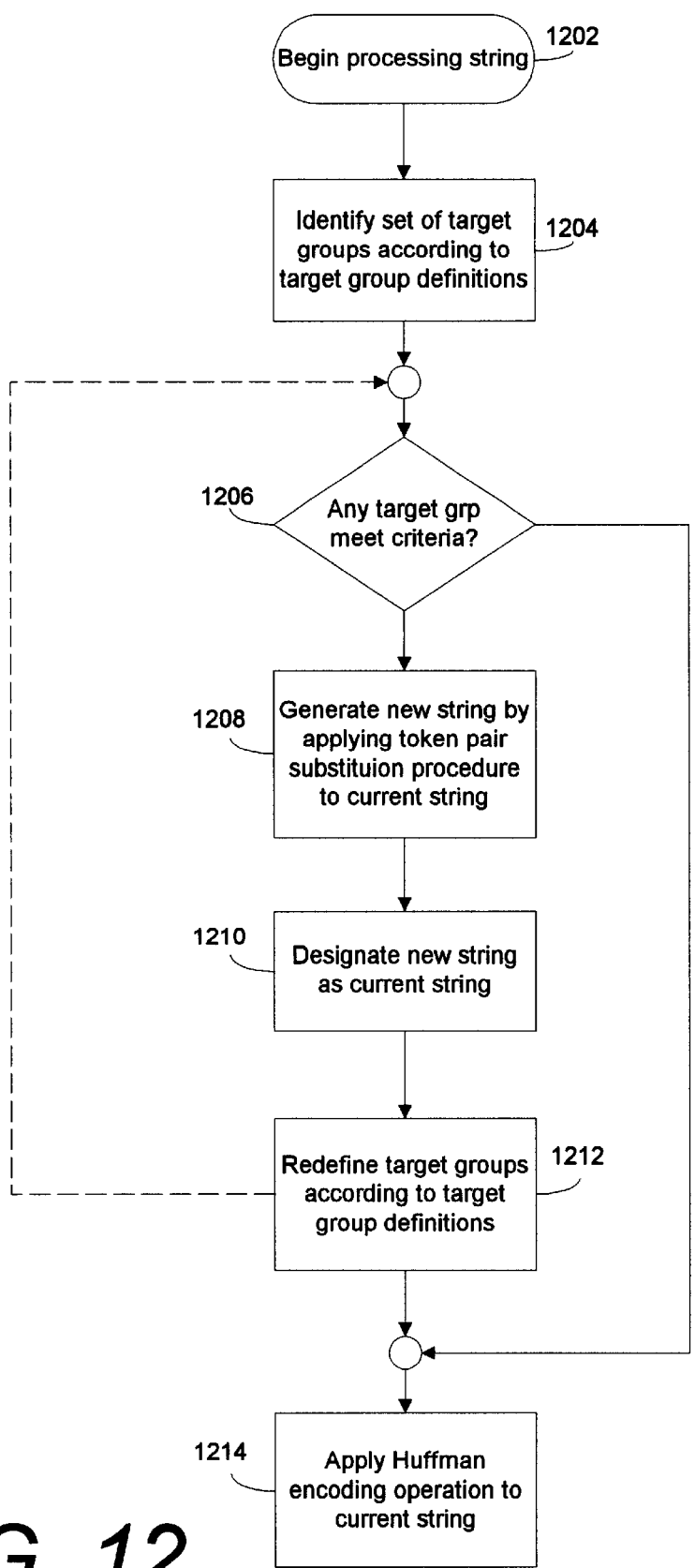
FIG. 12 is a flow diagram illustrating the operation of a computer to encode a string of tokens.

Referring now to FIG. 12, it will be assumed that the encoder program 1120 is loaded in the computer 1104 and is then executed by the computer 1104 to encode a first string of tokens. It is assumed that the first string describes an image that is to be printed. It is within this context that the steps shown in FIG. 12 are now described.

At step 1202, the computer 1104 designates the first string as the "current string" and beings processing it. At step 1204, the computer 1104 identifies a set of three target groups by using the following set of definitions:

Def. #1: The first target group are those tokens in the current string that immediately follow an "A" token value;

Def. #2: The second target group are those tokens in the current string that immediately follow a "B" token value; and Def. #3: The third target group are those tokens in the current string that immediately follow a "C" token values Thus, the first target group may be referred to as having an "A" reference value; the second target group a "B" reference value; and the third target group a "C" reference value. The reader will note that these definitions are based upon the known correlations that often exist in token strings generated in the system.

At step 1206, the computer 1104 operates to identify those target groups that have a local frequency distribution that meet certain pre-determined criteria. Similar to the first embodiment, a given target group meets the criteria if the following two relationships are true:

Relationship #1:f(max)>f(max−1)+f(max−2); and Relationship #2: f(max)>N

If none of the target groups meet the criteria of step 1206, then the first string is Huffman encoded (step 1214). In part, this accomplished by Huffman encoding each of the three target groups based upon their respective local frequencies.

If, however, one or more target groups are identified at step 1206 then the first string is converted into a second string by substituting certain token pairs in the first string with single representative tokens (step 1208).

Figure 13:
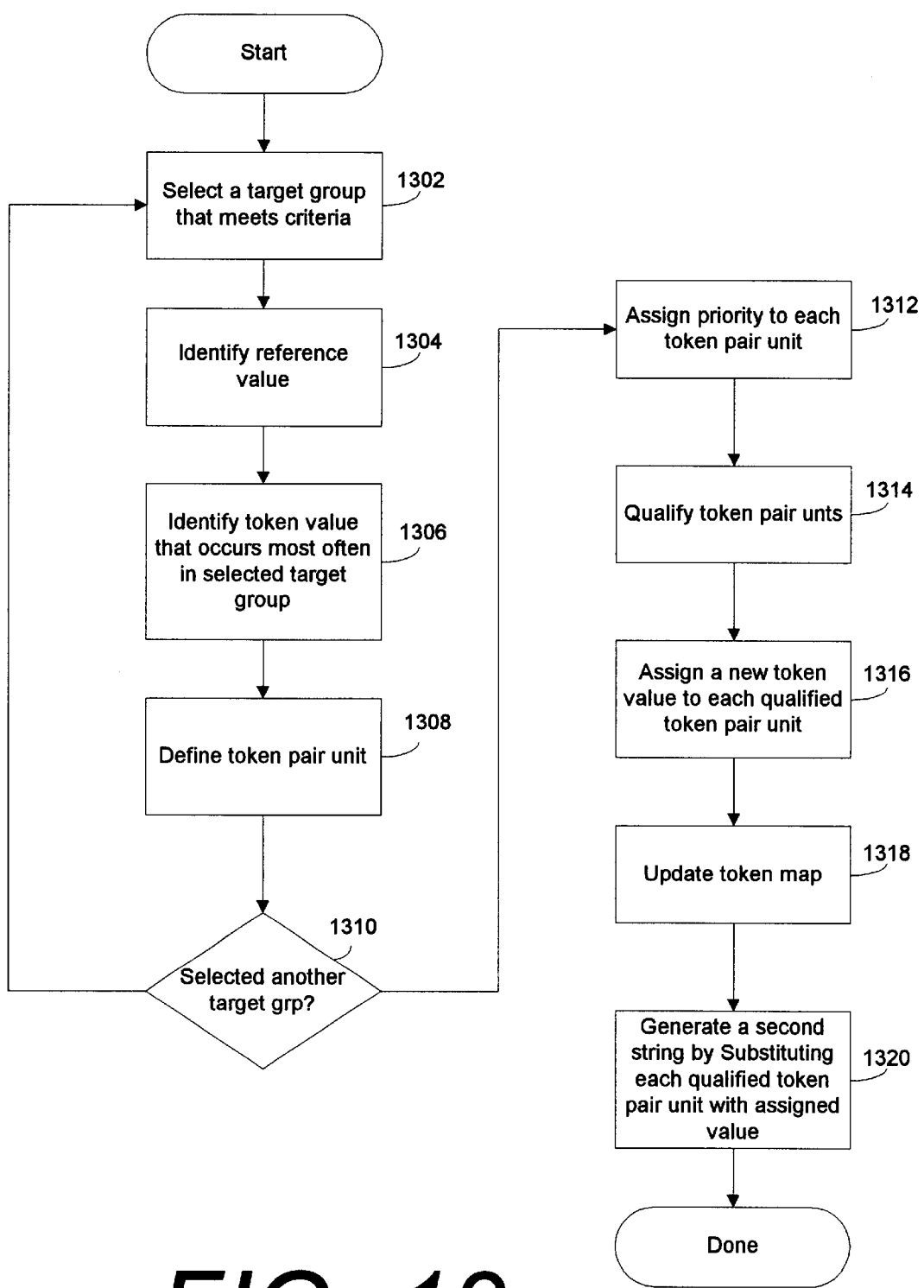
FIG. 13 illustrates further the operation of the computer to encode a string of tokens.

FIG. 13 is a flow diagram illustrating the procedure followed at step 1208 assuming more than one target group is identified at step 1206. Turning now to FIG. 13, the computer 1104 operates to select one of the identified target groups (step 1302). Next, the computer 1104 identifies the selected target group's reference value and the token value that occurs most often in the selected target group (steps 1204 and 1208. The computer 1104 then defines a token-pair unit based upon these two values (step 1308). The first token has the value identified at step 1304, the second token has the value identified at step 1306.

Thus, for example, if the target group selected is the first target group and token "B" is the value that occurs most often in the first target group, then the token-pair unit defined at step 1308 would be "A B".

After the token-pair unit is defined, the next identified target group is selected (step 1310) and the steps just described are repeated. This continues until all target groups that meet the criteria of step 1206 have been selected and processed.

Next, each defined token-pair unit is assigned a priority based upon the respective frequency of occurrence in the first string (step 1312). Those that occur more often are assigned a higher priority that those that occur less often.

Next, the computer 1104 operates to "qualify" token-pair units defined at step 1308 for token pair substitution (step 1314). Those token-pair units that may overlap with higher priority token-pair units are not qualified. Those token-pair units that will not overlap with higher priority token-pair units are qualified. To illustrate this step further, consider briefly FIG. 14.

Figure 14:
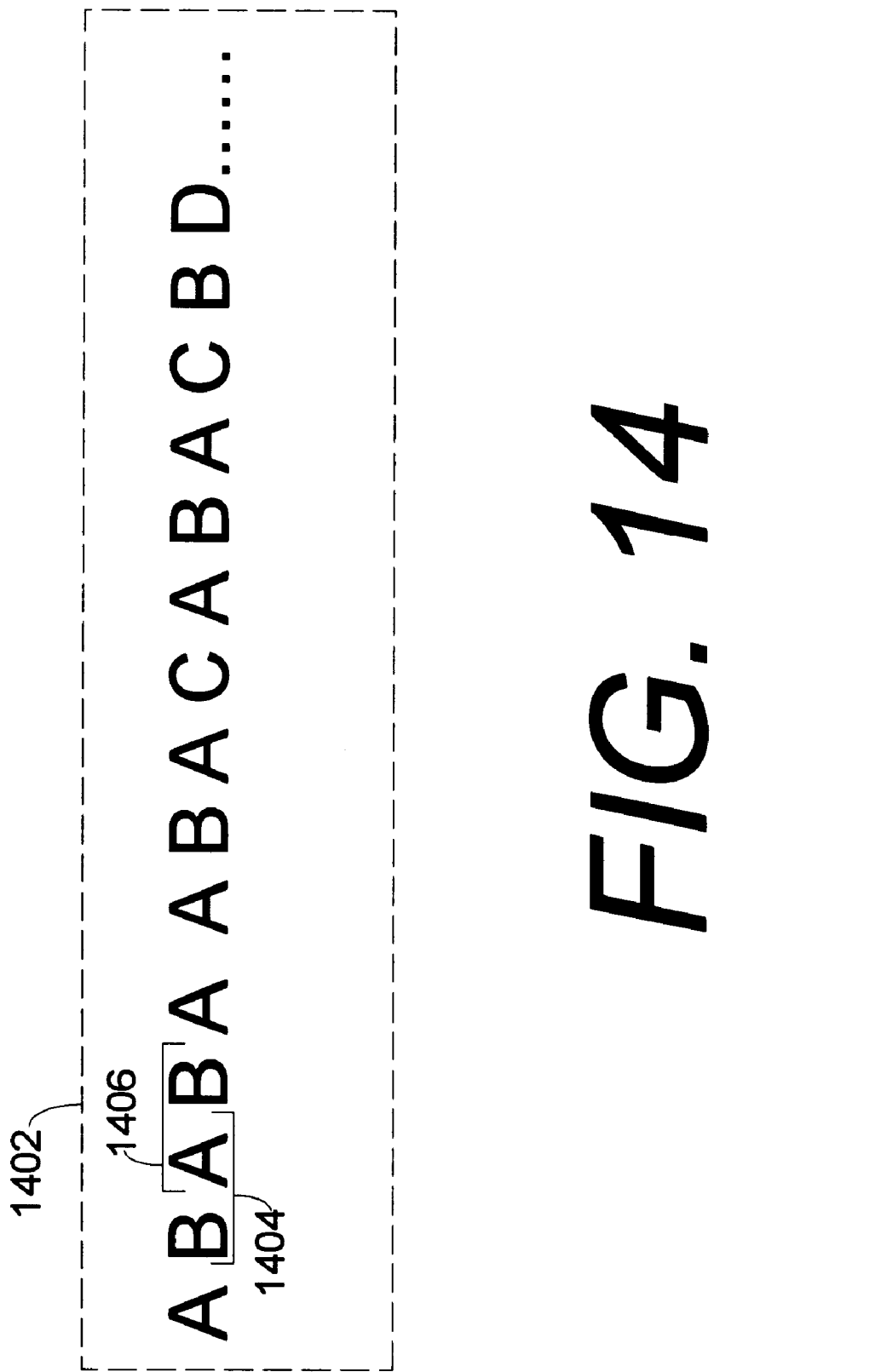
FIG. 14 is a flow diagram illustrating an exemplary string of tokens.

FIG. 14 depicts a portion of a token string 1402. Assume that the string 1402 is the "current string" and it is assumed two token-pair units have been defined: "B A" and "A B". Further assume that token-pair unit "BA" is assigned a higher priority than token-pair unit "A B". It can be seen that "B A" and "AB" can overlap. For example, "B A" instance 1404 overlaps with A B instance 1406. Because token-pair unit "B A" is assigned a higher priority than the token-pair unit AB, token-pair unit AB would not be qualified for token pair substitution at step 1314. Furthermore, token-pair unit "B A" would be "qualified" for token pair substitution at step 1314.

Turning again to FIG. 13, the computer 1104 operates to generates a new representative token value for each qualified token-pair unit and assigns the new token value to the qualified token-pair unit (step 1316). Next, the computer 1104 operates to generate and to store a token map indicating that each representative token value represents its assigned token-pair unit (step 1318).

For example, assume token-pair unit "A B" and token-pair unit "C D" are qualified token-pair units. Also assumed that token "E" and token "F" does not occur in the first string. At step 1316, the computer 1104 may assign an "E" token to the token-pair unit "A B" and an "F" token to the token-pair unit "CD". The token map generated at step 1318 would then indicate that E=AB and F=CD.

Next, the computer 1104 operates to produce a second string by substituting each instance of a qualified token-pair unit in the string with its assigned single token value (step 1320).

Turning again to FIG. 12, after the second string is generated it is then designated as the current string (step 1210). Next, the computer 1104 operates to identify a set of target groups in the second string using the same three target group definitions (step 1212). In some implementations, the computer 1104 may then repeat steps 1206–1212 until a string is generated wherein none of the three target groups meet the criteria of step 1206.

Once this condition occurs, the computer 1104 operates to apply a Huffman encoding operation to the string (step 1214). Importantly, each target group in the string is Huffman encoded based upon local frequencies. The rest of the tokens are Huffman encoded based upon the aggregate frequencies of the string.

Figure 15:
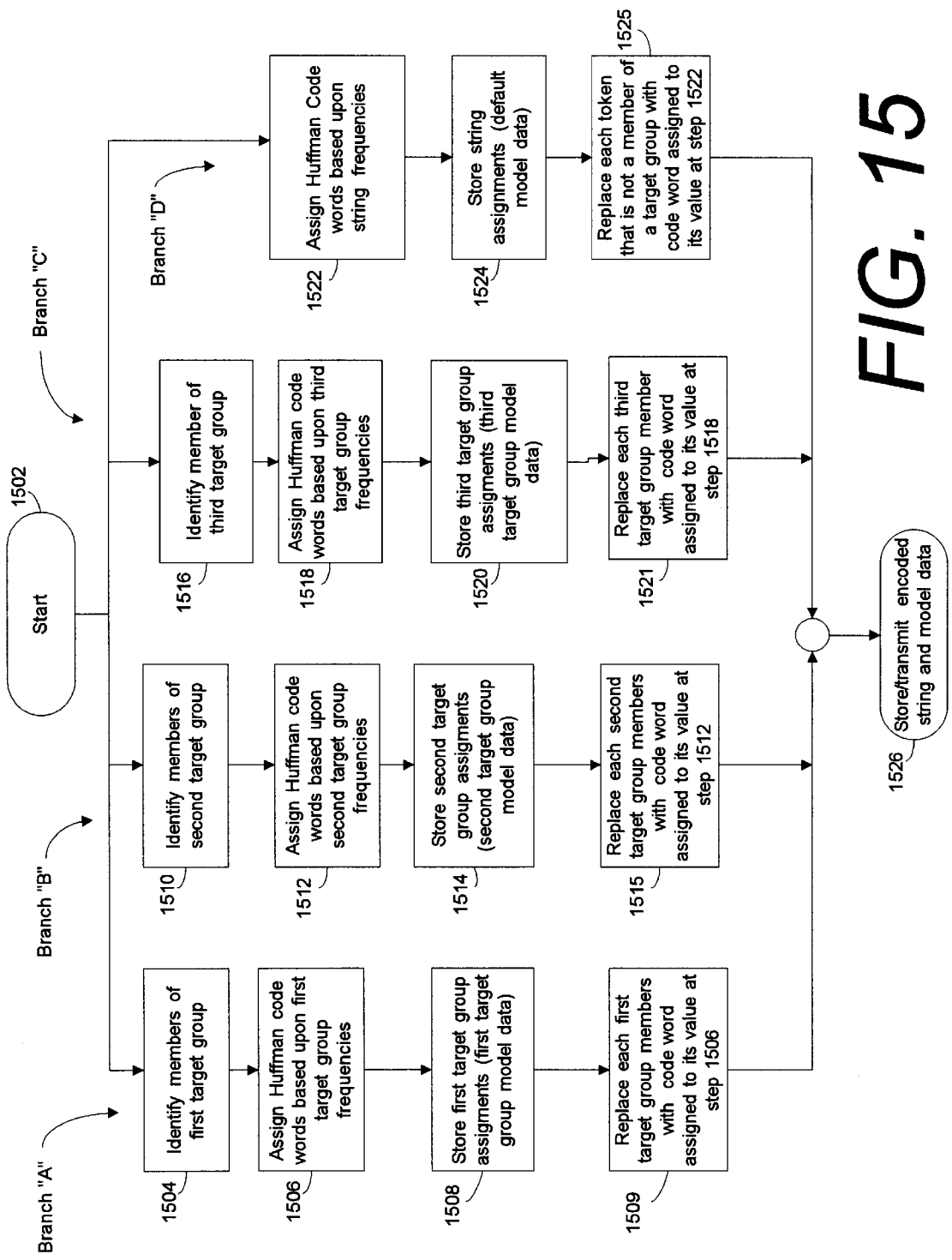
FIG. 15 is a flow diagram illustrating a new Huffman encoding operation.

FIG. 15 is a flow diagram illustrating the operation of the computer 1104 to Huffman encode a string at step 1214. Turning now to FIG. 15, the computer 1104 begins processing the string at step 1502.

Branch A (steps 1504–1509)

At step 1504, the computer 1104 operates to identify each member of the first target group. As noted above, the first target group are those tokens in the string that immediately follow an "A" token.

At step 1506, the computer 1104 operates to assign a Huffman codeword to each token value that occurs in the first target group. Importantly, the codeword is assigned based upon the local frequencies of the first target group.

At step 1508, the computer 1104 generates data describing these assignments and stores the data. The assignments made at step 1506 will be referred to as the "first target group model data". The data stored at step 1508 will be referred to as "first target group model data".

At step 1509, the computer 1104 operates to replace each member of the first target group with the codeword assigned to its value at step 1506.

Branch B (steps 1510–1515)

At step 1510, the computer 1104 operates to identify each member of a second target group. As noted above, the second target group are those tokens in the string that immediately follow a "B" token.

At step 1612, the computer 1104 operates to assign Huffman codewords to each token value that occurs in the second target group. Importantly, the codewords are assigned according to the Huffman encoding process based upon the local frequencies of the second target group.

At step 1514, the computer 1104 generates data describing these assignments and stores the data. The data stored at step 1514 will be referred to as the "second target group model data".

The assignments made at step 1512 will be referred to as the "second target group model data". The data stored at step 1514 will be referred to as "second target group model data".

At step 1515, the computer 1104 operates to replace each member of the second target group with the codeword assigned to its value at step 1512.

Branch C (steps 1516–1521)

At step 1516, the computer 1104 operates to identify each member of a third target group. As noted above, the third target group are those tokens in the string that immediately follow a "C" token.

At stop 1518, the computer 1104 operates to assign Huffman codewords to each token value that occurs in the third target group. Importantly, the codewords are assigned according to the Huffman encoding process based upon the local frequencies of the third target group.

At step 1520, the computer 1104 generates data describing these assignments and stores this data. The assignments made at step 1518 will be referred to as the "third target group model". The data generated and stored at step 1520 will be referred to as "third target group model data".

At step 1521, the computer 1104 operates to replace each member of the third target group with the codeword assigned to its value at step 1518.

Branch D (step 1522–1525)

At step 1522, the computer 1104 operates to assign Huffman codewords to each token value that occurs in the string. Importantly, in this embodiment, these codewords are assigned based upon the aggregate frequencies of the string. It is noted that in alternative embodiments, the codewords are assigned based upon the local frequencies of a fourth target group. The fourth target group consisting of those tokens in the string that are not members of the first, second and third target groups.

At step 1524, the computer 1104 generates data describing these assignments and stores this data. The assignments made at step 1522 will be referred to as the default Huffman model data. The data stored at step 1524 will be referred to as "default model data".

At step 1525, the computer 1104 operates to replace each token in the string which are not members of a target group with the codeword assigned to its value at stop 1522.

After performing steps 1509, 1515, 1521 and 1525 the string is encoded. At step 1526 the computer stores the encoded string and transmits it, along with the model data, to the printer 1106 for printing.

Now lets consider how the printer 1106 operates, under the direction of the decoder program 1140, to decode an encoded string received from the computer 1104. As indicated above, it will be assumed that the encoded string represents an image to be printed.

Figure 16:
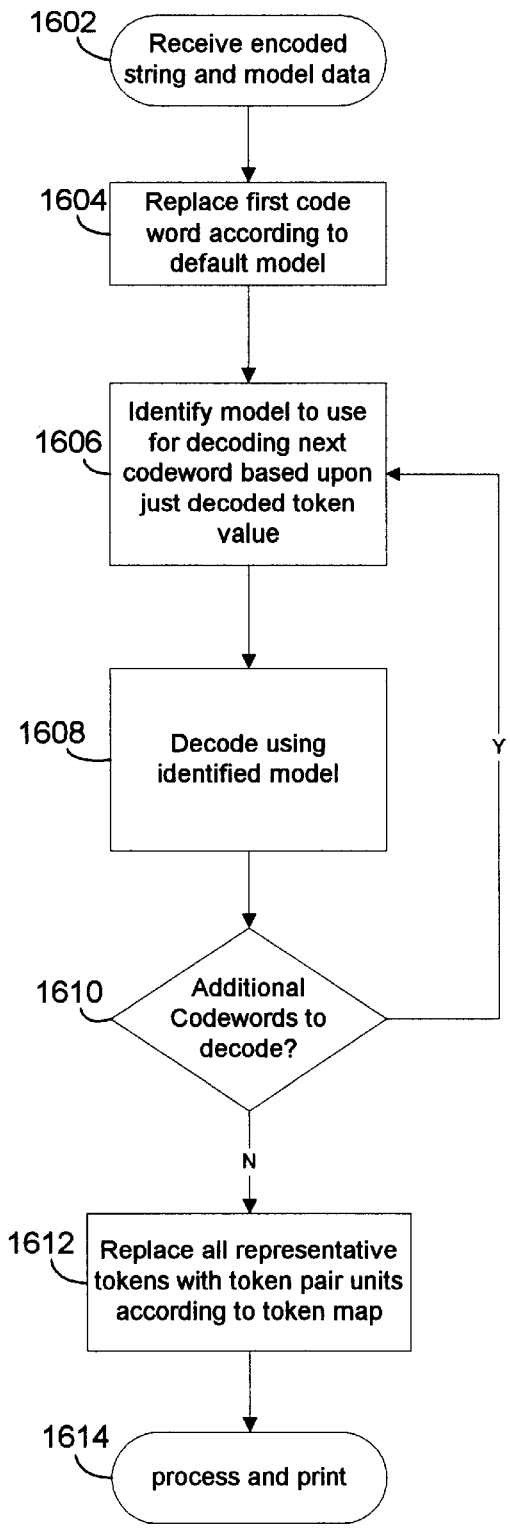
FIG. 16 is a flow diagram illustrating the decoding operation.

Referring now to FIG. 16, at step 1602 the printer 1106 receives the string and the model data. At step 1604, the printer 1106 replaces the first codeword a token value according to the default Huffman model.

At step 1606, the printer 1106 then identifies the model to use for decoding the next codeword. If the just decoded token value is an "A" value, the printer 1106 determines that the next codeword should be decoded according to the first target group model. If the just decoded token is a "B" value, then the printer 1106 determines that the next codeword should be decoded according to the second target group model. If the just decoded token is a "C" value, then the printer 1106 determines that the next codeword should be decoded according to the third target group model. If the just decoded token is not an "A", "B" or "C" value, then the printer 1106 determines that the next codeword should be decoded according to the default model.

At step 1608, the printer 1106 replaces the next codeword with a token value according to the model identified at step 1606.

After the codeword is decoded, the printer 1106 the determines if there are additional codewords in the string to decode (decision step 1610). If so, then the printer 1106 operates to repeat steps 1606–1610. This continues until all the codewords have been decoded into tokens.

After the codewords have been decoded, the printer 1106 operates to replace all representative tokens in the string with its assigned token-pair units (step 1612). The information needed to perform this step is obtained from the token map data. It is noted that in some embodiments step 1612 is performed in parallel with iterative steps 1606–1610.

At step 1614, the decoding procedure ends and the printer 1106 proceeds to further process the decoded token string and print the image represented by decoded token string.

It is noted that in the first embodiment, the memory 108 may represent both volatile and nonvolatile components. Volatile components are those that do not retain data upon loss of power. Nonvolatile components are those that retain data upon a loss of power. Thus, the memory 108 may comprise, for example, one or more of the following: random access memory (RAM), read only memory (ROM), hard disk drives, floppy disk drive, magnetic tapes accessed via an appropriate tape drive, optical storage media accessed via an appropriate drive, etc. In addition, the processor 106 may represent a single or multiple processors.

Furthermore, in the embodiments just described, the functionality provided by any one of the programs described may alternatively be provided in whole or in part by hardware components. For example, one or more of the steps illustrated in FIG. 2 could be performed by operation of an application specific integrated circuit having appropriate logic gates, a programmable gate array (s) (PGA) or a field programmable gate array (FPGA). Additionally, the programs are explained by reference to flow charts. It is understood that any of the steps depicted in these flow charts may be performed in a different sequence shown. In fact, some steps may be performed concurrently or with partial concurrence.

Furthermore, the present invention may be embodied in the form of a computer readable medium that has any one of the programs described above embodied therein. For example, the memory 108 and the storage medium 1115 may both be considered embodiments of the invention. Importantly, the phrase "computer readable medium" can refer to any medium that can contain, store or propagate computer readable code. Thus, in this context, computer readable medium may refer to a tangible medium such as a CD ROM or an intangible medium, such as signals that are used to communicate the computer readable code over a network or the INTERNET.

From the foregoing it will be apparent that the invention provides a novel and advantageous method of encoding and decoding data that can be used in a variety of systems. Accordingly, although several specific embodiments of the invention has been described and illustrated, the invention is not to be limited to specific forms or arrangements of parts so described and illustrated. The invention is limited only by the claims and the equivalents thereof.

What is claimed is:

1. A method of compressing a first string of tokens including a group of tokens that immediately follow a token having a first value, comprising:

(a) selecting a token value that occurs in the group based upon the group's local frequencies; and (b) generating a second string by substituting each occurrence of a token-pair unit in the first string with a single token having a second value; and wherein the token-pair unit includes a first token having the first value and a second token having the selected value.

2. The method of claim 1, further comprising:

(c) entropy encoding the second string of tokens, at least in part, by entropy encoding a first group of tokens in the second string based upon the local frequencies of the first group, wherein the first group of tokens being those tokens in the second string that immediately follow a token having the first value.

3. The method of claim 2, wherein the first group of tokens are interspersed throughout the first string of tokens and the second group of tokens are interspersed throughout the second string of tokens.

4. The method of claim 1, further comprising:

(c) Huffman encoding the second string of tokens, at least in part, by Huffman encoding a first group of tokens in the second string based upon the first group's local frequencies; and wherein the first group of tokens being those tokens in the second string that immediately follow a token having the first value.

5. The method of claim 4, wherein the token value selected in step (a) is the value the occurs most often in the group.

6. The method of claim 1, further comprising:

(c) producing a Huffman encoded string at least in part by Huffman encoding a second group of tokens in the second string based upon the local frequencies of the second group, wherein the second group of tokens being those tokens in the second string that immediately follow a token having the first value;

(d) storing the Huffman encoded string in memory; and (e) transmitting the Huffman encoded string to an external device.

7. The method of claim 6, wherein the external device is a printing device.

8. The method of claim 2, wherein the method is performed by a printing device.

9. Apparatus for compressing a first string of tokens including a first group of tokens each having a first value and a second group of tokens each immediately following a unique one of the tokens in the first group, comprising:

(a) means for selecting a token value from the second group based upon the local frequencies of the second group;

(b) means for defining a token-pair unit, the token-pair unit including a first token having the first value and a second token having the selected value; and (c) means for converting the first string into a second string in part by substituting each occurrence of the token-pair unit in the first string with a single token having a third value.

10. The apparatus of claim 9, further comprising:

(d) means for Huffman encoding the second string in part by Huffman encoding a third group of tokens in the second string based upon the local frequencies of the third group; the third group being those tokens in the second string that immediately follow a token having the first value.

11. The apparatus of claim 9, further comprising:

(d) means for entropy encoding the second string, in part by entropy encoding a third group of tokens in the string based upon the local frequencies of the third group; the third group being those tokens in the second string that immediately follow a token have the first value.

12. The apparatus of claim 10, wherein the second group of tokens are interspersed throughout the first string.

13. The apparatus of claim 12, wherein the third group of tokens are interspersed throughout the second string.

14. The apparatus of claim 13, further comprising:

(d) means for storing the Huffman encoded second string in a memory.

15. A computer readable medium embodying a program of instruction executable by a computer to perform method steps for encoding a string of tokens including a first group of interspersed tokens each having a first value, the method steps comprising:

(a) identifying a second group of tokens in the string, the second group being those tokens that immediately follow one of the tokens in the first group; and (b) selecting a token value from the second group having a highest frequency of occurrence in the second group; and (c) converting the string of tokens into a second string of tokens by substituting each occurrence of a token-pair unit in the first string with a single token, wherein the token-pair unit includes a first token having the first value and a second token having the value selected in step (b).

16. The computer readable medium of claim 15, wherein the method steps further comprising:

(d) Huffman encoding the second string.

17. The computer readable medium of claim 16, wherein step (d) includes the following substep: Huffman encoding a third group of tokens in the second string based upon the local frequencies of the third group; and wherein the third group of tokens are those tokens that immediately follow a token having the first value.

18. The computer readable medium of claim 17, wherein the method steps further comprise:

(e) storing a Huffman encoded string produced by performing step (d) in memory.

19. The computer readable medium of the claim 18, wherein the second group of tokens are interspersed throughout the second string.

20. The computer readable medium of claim 19, wherein the second group of tokens is representative of an image and the method steps further comprise:

(f) converting the Huffman encoded string into a printed form of the image.

* * * * *